US008140291B2

(12) United States Patent
Kasztenny et al.

(10) Patent No.: US 8,140,291 B2
(45) Date of Patent: Mar. 20, 2012

(54) STATOR TURN FAULT DETECTION APPARATUS AND METHOD FOR INDUCTION MACHINE

(75) Inventors: Bogdan Z. Kasztenny, Markham (CA); Somakumar Ramachandrapanicker, Karnataka (IN); Arvind Kumar Tiwari, Karnataka (IN); Arijit Banerjee, Karnataka (IN)

(73) Assignee: General Electric Company, Niskayuna, NY (US)

( * ) Notice: Subject to any disclaimer, the term of this patent is extended or adjusted under 35 U.S.C. 154(b) by 527 days.

(21) Appl. No.: 12/365,118

(22) Filed: Feb. 3, 2009

(65) Prior Publication Data
US 2010/0194324 A1 Aug. 5, 2010

(51) Int. Cl.
*G05R 31/00* (2006.01)

(52) U.S. Cl. ........ 702/115; 318/490; 318/690; 318/700; 318/727; 324/750.02; 324/537; 324/544; 702/58; 340/648

(58) Field of Classification Search .......... 318/490, 318/690, 700, 727; 324/750.02, 537, 544, 324/545, 546, 765.01; 702/58, 115; 340/648
See application file for complete search history.

(56) References Cited

U.S. PATENT DOCUMENTS

| 4,311,497 A * | 1/1982 | Newell .............................. 62/158 |
| 5,270,640 A | 12/1993 | Kohler et al. |
| 5,477,163 A * | 12/1995 | Kliman .................... 324/756.06 |
| 5,514,978 A * | 5/1996 | Koegl et al. ............. 324/750.02 |
| 5,786,708 A * | 7/1998 | Premerlani et al. ...... 324/765.01 |
| 6,041,287 A | 3/2000 | Dister et al. |
| 6,043,664 A * | 3/2000 | Kliman et al. ................ 324/545 |
| 6,141,196 A * | 10/2000 | Premerlani et al. ............. 361/78 |
| 6,169,489 B1 * | 1/2001 | Kliman et al. ................ 340/648 |
| 6,172,509 B1 * | 1/2001 | Cash et al. ..................... 324/546 |
| 6,236,227 B1 * | 5/2001 | Kliman et al. ........... 324/765.01 |
| 6,236,947 B1 | 5/2001 | Dowling et al. |
| 6,429,616 B1 * | 8/2002 | Myers et al. .................. 318/459 |
| 6,611,771 B1 * | 8/2003 | Habetler et al. ................ 702/58 |
| 6,636,823 B1 * | 10/2003 | Unsworth et al. ............ 702/115 |
| 7,127,373 B2 | 10/2006 | House et al. |
| 7,592,772 B2 * | 9/2009 | Nandi et al. .................. 318/798 |
| 2010/0169030 A1 * | 7/2010 | Parlos ............................. 702/58 |

FOREIGN PATENT DOCUMENTS
WO WO9737236 A1 10/1997

OTHER PUBLICATIONS

Sottile, Joseph Jr.; An On-Line Method to Detect Incipient Failure of Turn Insulation in Random-Wound Motors; IEEE Transactions on Energy Conversions, vol. 8, No. 4, Dec. 1993.

(Continued)

*Primary Examiner* — Rita Leykin
(74) *Attorney, Agent, or Firm* — Richard A. DeCristofaro

(57) ABSTRACT

A system and method are provided for correction of parameters used in determination of stator turn faults of an induction motor. An embodiment may include determining a residual impedance and/or a residual voltage of the motor, and correcting a normalized cross-coupled impedance based on the residual impedance and residual voltage. Additional embodiments may include measuring an operating temperature of the motor and determining a negative sequence impedance of the motor based on the temperature. Another embodiment may include measuring voltages and currents of the motor and determining phasors for the voltages and currents using compensation for variations from a nominal frequency of the motor.

16 Claims, 8 Drawing Sheets

OTHER PUBLICATIONS

PCT International Search Report dated Dec. 13, 2010 and Written Opinion.

Bellini et al., "Experimental Validation of a Robust Diagnostic Index for Induction Motors Stator Faults", The 30th Annual Conference of the IEEE Industrial Electronics Society, vol. 2, Busan, Korea, pp. 1367-1373, Nov. 2-6, 2004.

Cardoso et al., "Inter-Turn Stator Winding Fault Diagnosis in Three-Phase Induction Motors, by Park's Vector Approach", Electric Machines and Drives Conference Record, IEEE International, Milwaukee, Wisconsin, pp. MB1-5.1-MB1-5.3, May 18, 1997.

Yang et al., "Diagnosis of Stator Faults in Induction Motor Based on Zero Sequence Voltage After Switch-Off", Journal of Zheijang University Science A, vol. 9, No. 2, pp. 165-172, Feb. 5, 2008.

* cited by examiner

STATOR TURN FAULT DETECTION APPARATUS AND METHOD FOR INDUCTION MACHINE

BACKGROUND

The invention relates generally to detecting turn faults in the stator of alternating current (AC) induction motors.

AC induction motors are used in a wide array of applications and processes. An AC induction motor typically includes a stationary portion, a "stator," and a rotating portion, a "rotor." In a 3-phase AC motor, power is applied to the stator to induce a magnetic field, causing the rotor to turn and generate mechanical energy. The stator may include any number of "windings," or wound poles that carry the current necessary to induce the magnetic field. These windings may also be characterized by the "turns" in the winding.

In many environments, the windings in the stator are subject to shorts between the turns of the windings, commonly referred to as "turn faults." In operating such motors, various algorithms may be used to determine the state of the motor. For example, an algorithm may be used to determine the number of turn faults. The parameters used in these algorithms, such as voltages and currents, may be measured using measuring equipment such as current transformers and potential transformers. Variation in the instruments, such as gain and phase delays, may result in erroneous measurements that lead to false results from the algorithm. Additionally, changes in environmental conditions may also affect the accuracy and precision of the measuring equipment.

BRIEF DESCRIPTION

A method is provided of determining turn faults in a stator of a motor. The method includes determining a residual voltage from a negative sequence voltage, a negative sequence current and a negative sequence impedance, determining a residual impedance, and determining a parameter indicative of the number of turn faults in the stator, based on the residual voltage, residual impedance, or a combination thereof.

Another method improving an algorithm for determining turn faults in a stator of a motor is provided. The method includes determining phasors of a plurality of voltages and currents, wherein the determining includes compensating for variations from a nominal frequency, determining symmetrical components based on the phasors, and determining a parameter indicative of the number of turn faults in the stator based on the symmetrical components.

Another method improving an algorithm for determining turn faults in a stator of a motor is provided. The method includes tuning the negative sequence impedance depending on the temperature measuring a temperature of the motor, modifying the negative sequence impedance based on the temperature, and determining a parameter indicative of the number of turn faults in the stator based on the negative sequence impedance.

A system for determining turn faults in the stator of a motor is provided. The system includes a device coupled to the induction motor and configured to measure characteristics of the motor. The device includes a memory. The memory includes instructions for determining a residual voltage, determining a residual impedance, and determining a parameter indicative of the number of turn faults in the stator based on the residual voltage, residual impedance, or a combination thereof.

DRAWINGS

These and other features, aspects, and advantages of the present invention will become better understood when the following detailed description is read with reference to the accompanying drawings in which like characters represent like parts throughout the drawings, wherein.

Figure 4A:
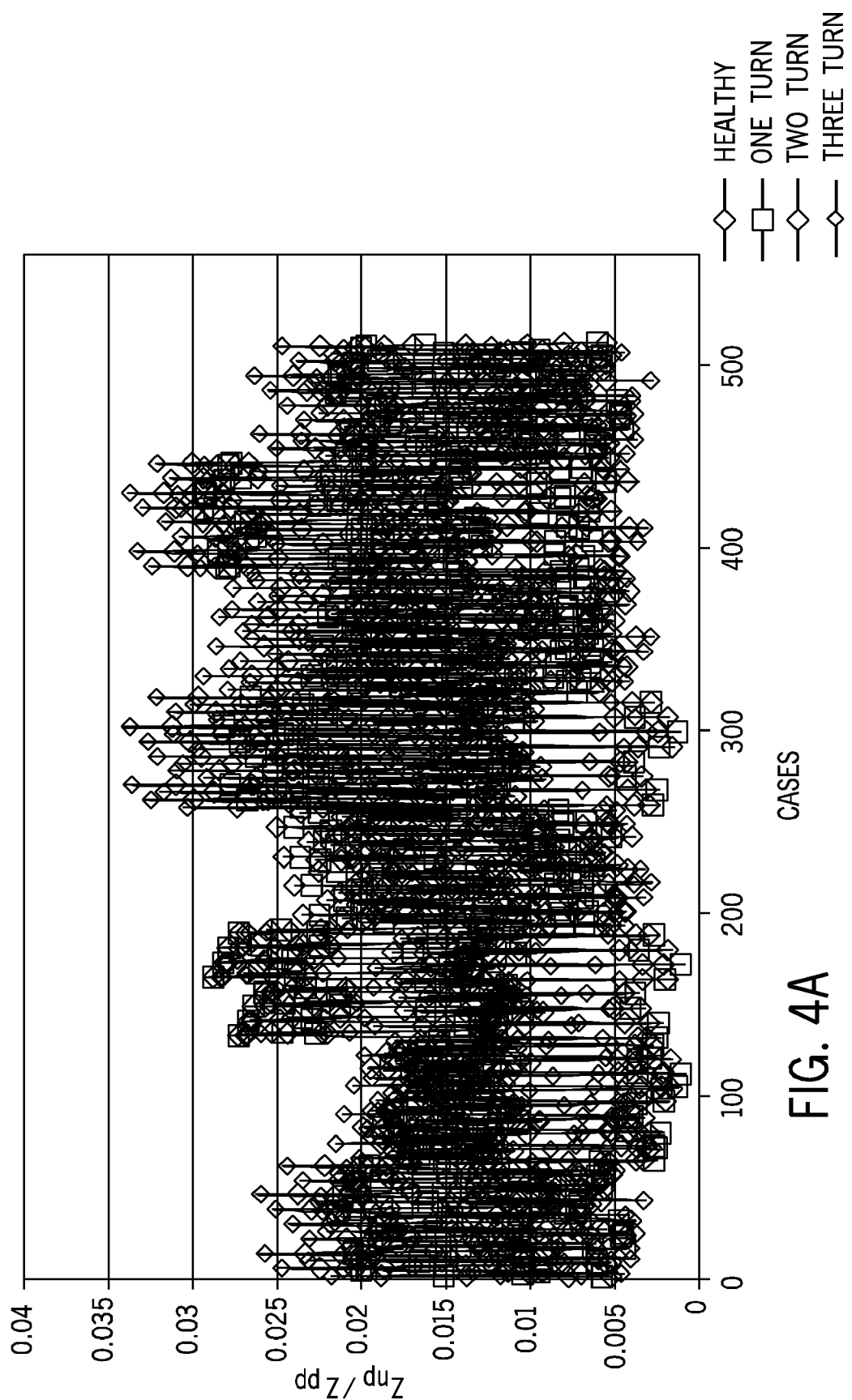
Figure 4B:
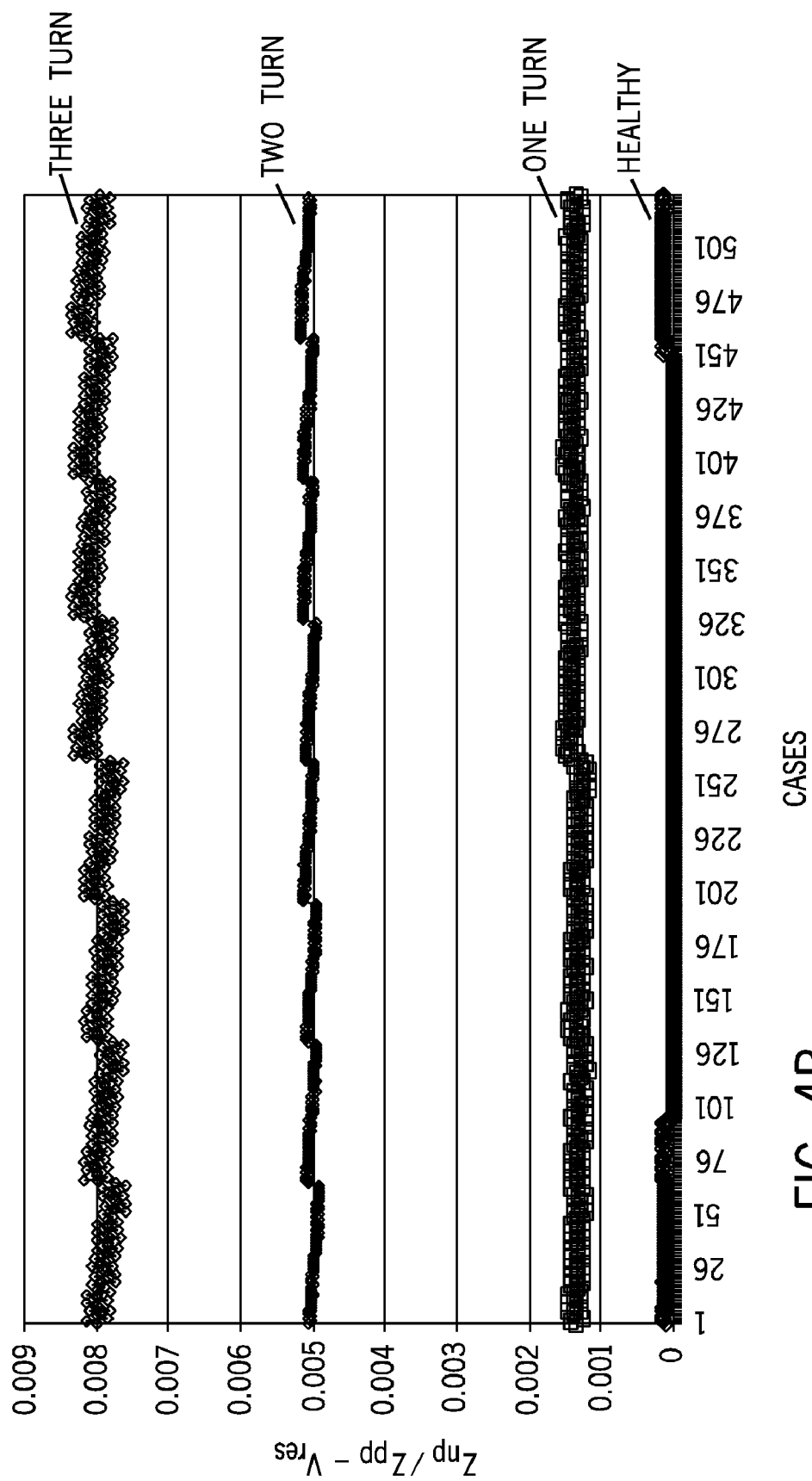
Figure 4C:
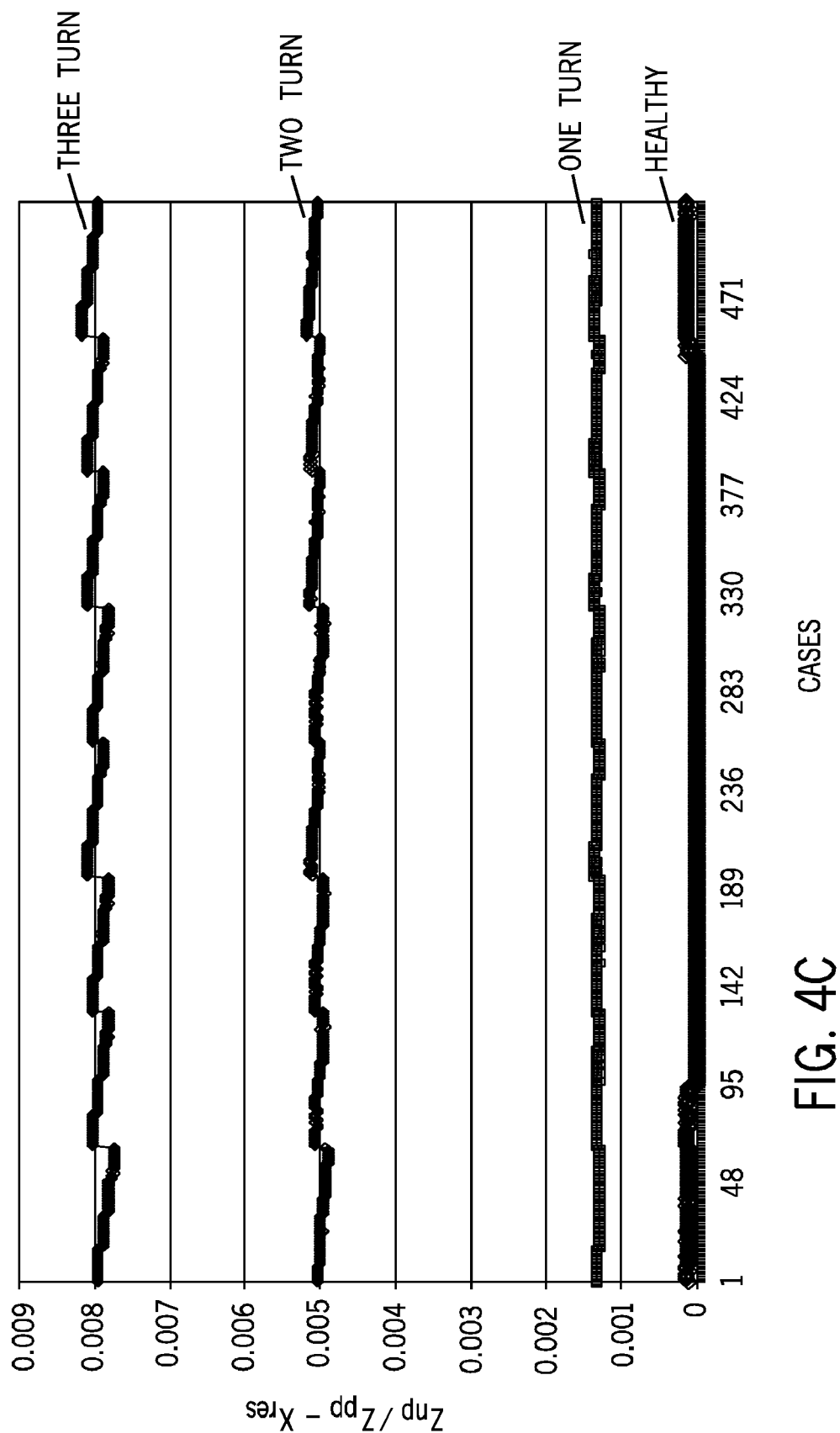
Figure 5:
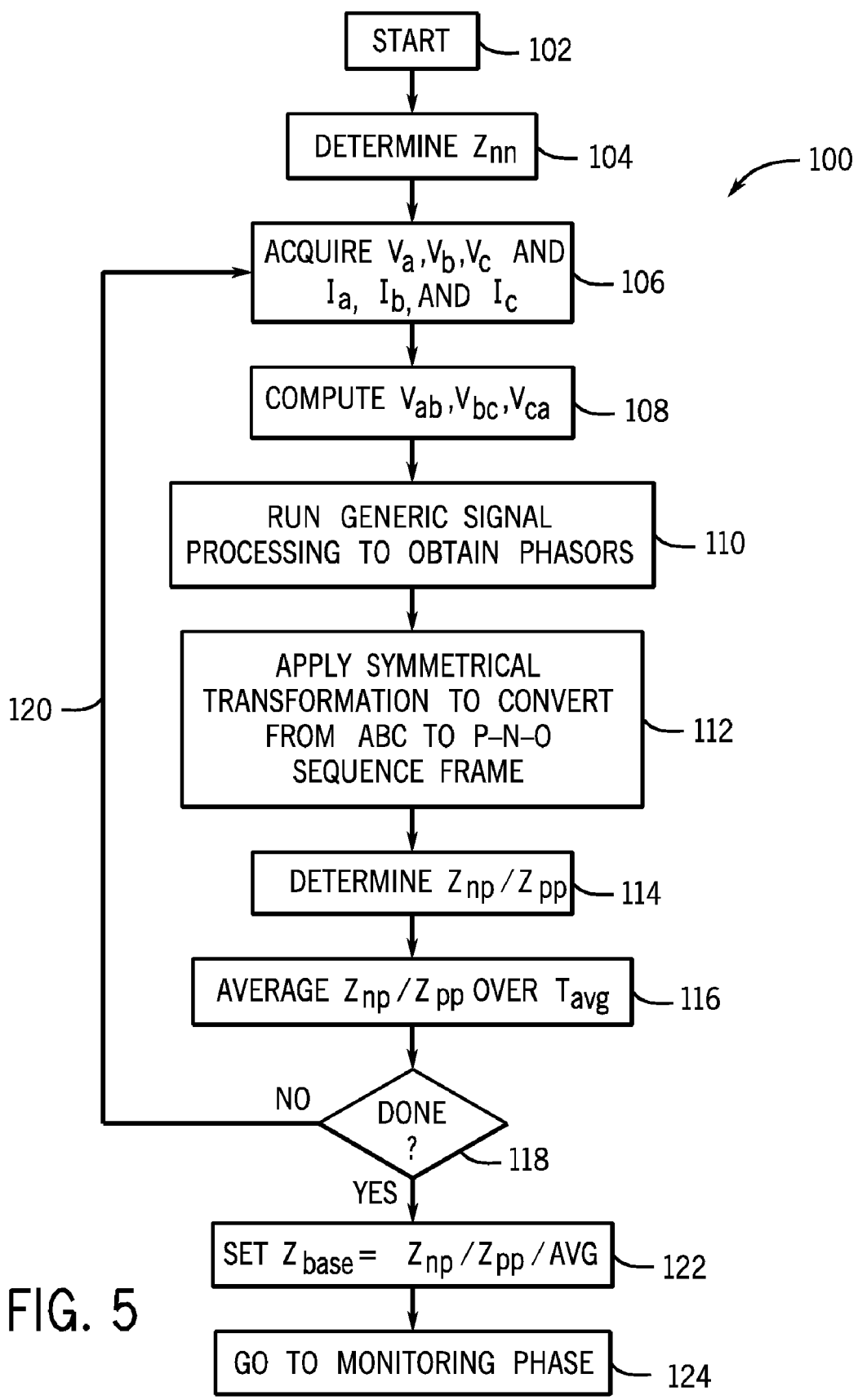
Figure 6:
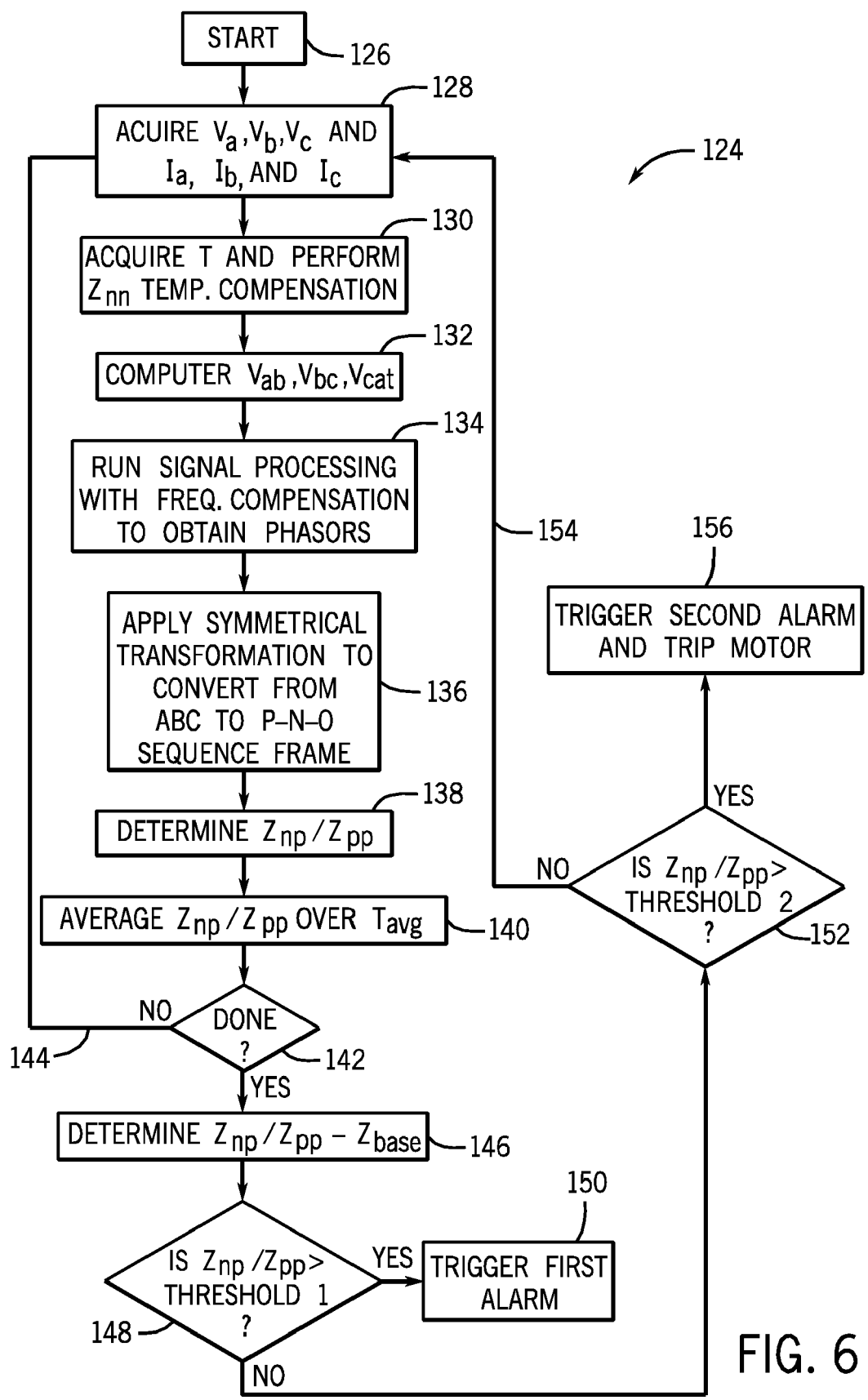

FIGS. 4A-C depict graphs of the normalized cross-coupled impedance for different combinations of gains and phase changes of current transformers and potential transformers in accordance with an embodiment of the present invention;

FIG. 5 depicts a process for a learning phase operation of an induction motor in accordance with an embodiment of the present invention; and FIG. 6 depicts a process for a monitoring phase operation of an induction motor in accordance with an embodiment of the present invention.

DETAILED DESCRIPTION

Figure 1:
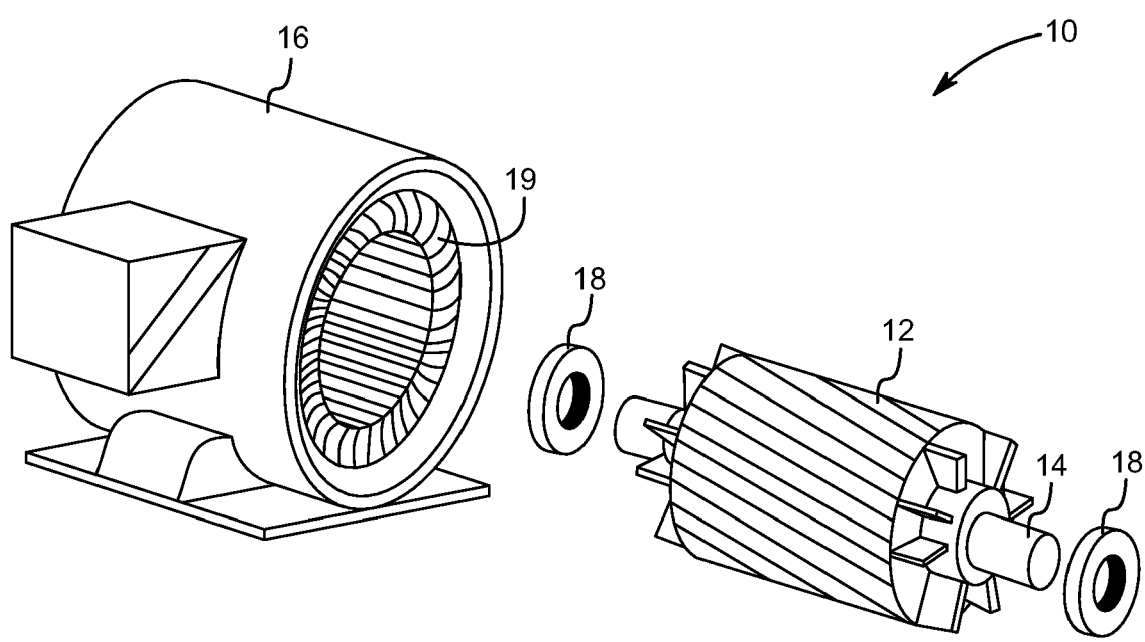
FIG. 1 is a diagrammatical perspective illustration of an induction motor in accordance with an embodiment of the present invention.

FIG. 1 is a diagrammatical perspective illustration of an induction motor 10. FIG. 1 is provided for illustrative purposes only, and embodiments of the present invention are not limited to any specific induction motor or configuration thereof. In the illustrated example, the motor 10 includes a rotor assembly 12, which includes a rotor shaft 14 extending through a rotor core. The rotor assembly 12 along with the shaft 14 can rotate inside the stator assembly 16 in a clockwise or a counter-clockwise direction. Bearing assemblies 18 that surround the rotor shaft 14 may facilitate such rotation within the stator assembly 16. The stator assembly 16 includes a plurality of stator windings 19 that extend circumferentially around and axially along the rotor shaft 14 through the stator assembly 16. During operation, a rotating magnetic field induced in the stator windings 19 reacts with the induced current in the rotor assembly 12 to cause the rotor assembly 12 to rotate, converting electrical energy to mechanical energy output through the shaft 14. In some embodiments, the motor 10 is a synchronous motor, and in other embodiments, the motor 10 is an asynchronous motor. Synchronous motors rotate at exactly the source frequency scaled up by the pole pair count, while asynchronous motors exhibit a slower frequency characterized by the presence of slip.

The stator windings 19 may be any suitable conducting material, such as copper wire, and may include insulation between the windings and other parts of the stator assembly 16. The windings 19 may be susceptible to chemical, mechanical, or electrical degradation that affects the performance of the stator assembly 16, which in turn affects the rotor assembly 12 and the energy output by the motor 10. Manufacturing defects may also cause poor performance of the windings 19. Turn faults in the windings 19 may interfere with current flow and the magnetic field induced in the stator assembly 16. Though the operation of the motor 10 is explained with a simple diagram, examples of the motor 10 are not limited to this particular simple design. Other more complicated designs are also applicable and may benefit from the techniques discussed in detail below.

Figure 2:
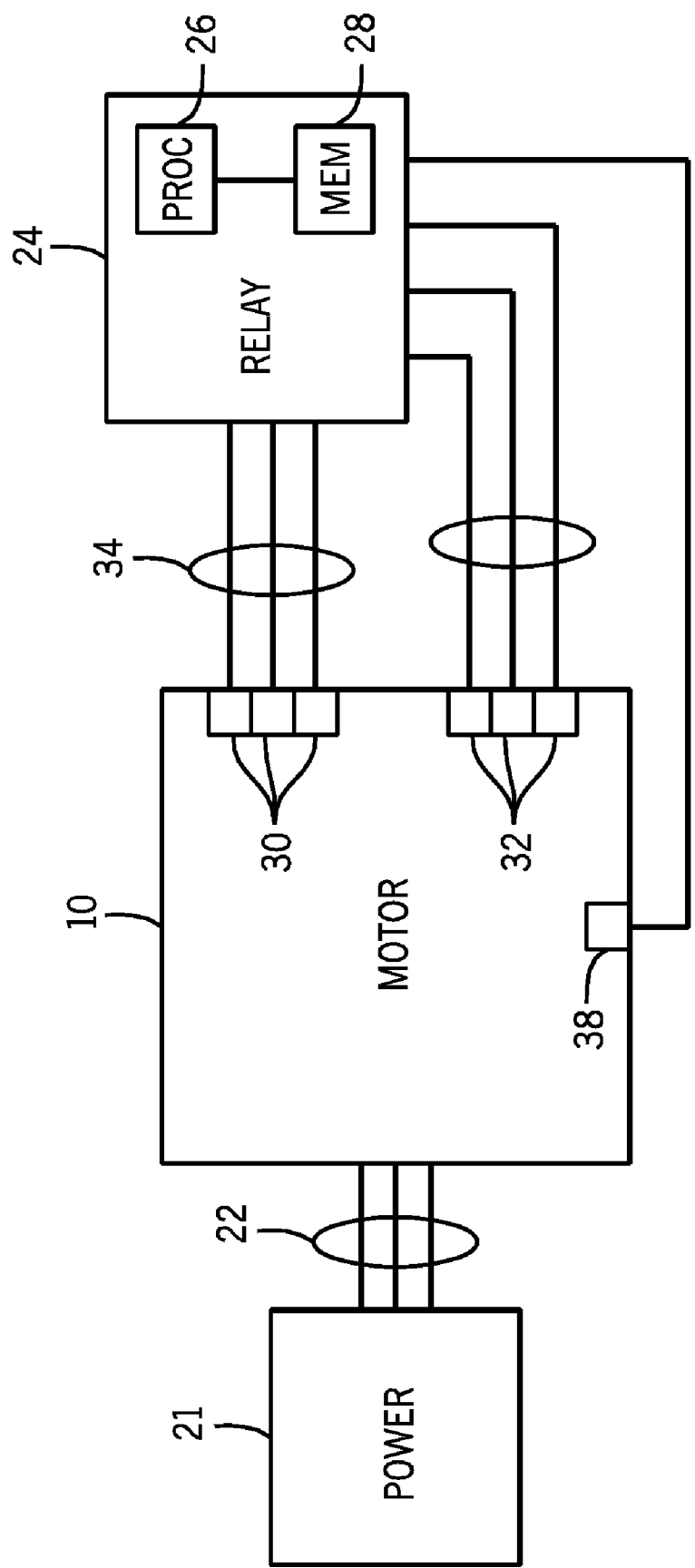
FIG. 2 is a block diagram of a system that includes the induction motor of FIG. 1 in accordance with an embodiment of the present invention.

FIG. 2 is a block diagram of a system 20 that includes the induction motor 10 of FIG. 1. The induction motor 10 may be coupled to a three-phase power source 21, such as an AC mains or other source of AC power. The three-phase AC power is delivered to the induction motor 10, as indicated by lines 22. To control and monitor the motor 10, a device 24, such as a relay, meter, or other suitable device, may be coupled to the motor 10. It should be appreciated that the device 24 may include components of, or may be, a computer. For example, as depicted in FIG. 2, the device 24 includes a processor 26 and a memory 28. The memory 28 may be any suitable volatile memory, non-volatile memory, or combination thereof. The memory 28 may store any parameters, algorithms, or other data for controlling and monitoring the motor 10, and allow access to this data by the processor 26.

The device 24 may monitor various parameters of the induction motor 10. In one embodiment, the voltages of the motor 10 may be monitored via three potential transformers 30 and three current transformers 32. The transformers 30 and 32 may be separate devices or may be included as a part of the motor 10 or the device 24. In other embodiments, more or less numbers of potential transformers and/or current transformers may be used.

As indicated by lines 34, the device 24 may receive motor phase current from the current transformers 30. Additionally, as indicated by lines 36, the device 24 may receive motor phase voltage from the potential transformers 32. It should be appreciated that various signal processing components may be included in the device 24 or between the motor 10 and the device 24, such as signal conditioners, amplifiers, filters, etc. Additionally, in some embodiments, the motor 10 may include a thermistor 38 and/or other suitable temperature sensor to send the temperature of the motor 10 to the device 24.

As will be appreciated, the device 24 may also convert the received three-phase parameters to symmetrical components, e.g., positive sequence (p) components, negative sequence (n) components, and zero sequence (0) components. For example, each phasor for three-phase current Ia, Ib, and Ic may be converted to symmetrical components $I_p$, $I_n$, and $I_0$. Similarly, each phasor of the three-phase voltages $V_a$, $V_b$, and $V_c$ may be converted to symmetrical components $V_p$, $V_f$, and $V_0$.

In one embodiment, the device 24 may determine various operating properties of the motor 10 to indicate the status of the motor 10. For example, in one embodiment the device 24 may determine normalized cross-coupled impedance as an indicator of the number of turn faults in the stator 16 of the motor 10, as described further in U.S. patent application Ser. No. 12/365,114, filed concurrently herewith, titled "Robust On Line Stator Turn Fault Identification System," by Arvind K. Tiwari et al., and herein incorporated by reference. The normalized cross-coupled impedance with respect to positive sequence impedance may be determined as follows:

$$\frac{Z_{np}}{Z_{pp}} = \frac{(V_n - Z_{nn} I_n)}{V_p} \quad (1)$$

where
$Z_{np}/Z_{pp}$ is the cross coupled impedance
$V_p$ is the positive sequence voltage
$V_n$ is the negative sequence voltage
$I_n$ is the negative sequence voltage
$Z_{pp}$ is the positive sequence impedance and
$Z_{nn}$ is the negative sequence impedance.

Other embodiments may also determine the normalized cross-coupled impedance with respect to negative sequence impedance as follows:

$$\frac{Z_{np}}{Z_{nn}} = \frac{\left(\frac{V_n}{Z_{nn}} - I_n\right)}{I_p} \quad (2)$$

where
$Z_{np}/Z_{pp}$ is the cross coupled impedance
$I_p$ is the positive sequence current
$V_n$ is the negative sequence voltage
$I_n$ is the negative sequence voltage and
$Z_{nn}$ is the negative sequence impedance.

Differences in the gain and phase of the measuring equipment, e.g., the potential transformers 30 and the current transformers 32, may generate errors in the current and voltage measurements used to derive the symmetrical component currents and voltages used in Equation 1. Further, the motor may have some inherent asymmetry due to manufacturing defects, which may manifest as residual voltages and residual currents. Some embodiments may include monitoring the motor over and above this asymmetry or defects in the windings. For example, in an embodiment, error compensation may include compensating the normalized cross-coupled impedance for residual voltage and residual impedance. A base value of residual voltage, $V_{base}$, and a base value of residual impedance ratio, $Z_{base}$, may be calculated from the symmetrical components of the parameters measured by the device 24. The values $V_{base}$, and $Z_{base}$ denote the residual value at the start of measurement. The base values incorporate the steady-state system errors including any measurement errors, and they may be averaged over a specified averaging duration. The base value of the residual voltage may be determined as follows:

$$V_{base} = \frac{1}{T} \sum_{t=0}^{t=T} (V_n - Z_{nn} I_n) \quad (3)$$

where
$V_{base}$, is the residual voltage
T is the averaging duration
$V_n$ is the negative sequence voltage
$Z_{nn}$ is the negative sequence impedance and
In is the negative sequence current.

Similarly, the base value of the residual impedance ratio, $Z_{base}$, may be determined as follows:

$$Zbase = \frac{1}{T} \sum_{t=0}^{t=T} \frac{V_n - Z_{nn} - I_n}{V_p} \quad (4)$$

where
$Z_{base}$ is the residual impedance ratio
T is the averaging duration
$V_n$ is the negative sequence voltage
$Z_{nn}$ is the negative sequence impedance
$I_n$ is the negative sequence current and
$V_p$ is the positive sequence voltage.

The averaging duration T can be tuned for any particular algorithm. For example, the averaging duration T may be 5 sec, 10 sec, 15 sec, 20 sec, 25 sec, etc.

Equation 1 for determining the normalized cross-coupled impedance (with respect to positive sequence) $Z_{np}/Z_{pp}$ may then include compensation based on the residual voltage $V_{base}$ or the residual impedance $Z_{base}$ determined in Equation 2 and Equation 3 respectively. The normalized cross-coupled impedance may account for the residual voltage $V_{base}$ as follows:

$$\frac{Z_{np}}{Z_{nn}} = \left| \frac{V_n - Z_{nn}I_n}{V_p} - V_{base} \right| \quad (5)$$

Similarly, the normalized cross-coupled impedance may account for the residual voltage $Z_{base}$ as follows:

$$\frac{Z_{np}}{Z_{nn}} = \left| \frac{V_n - Z_{nn}I_n}{V_p} - Z_{base} \right| \quad (6)$$

It should be appreciated that the normalized cross-coupled impedance with respect to negative sequence impedance, $Z_{np}/Z_{nn}$, may also be compensated for $V_{base}$ and $Z_{base}$ in the same manner. Thus, although the following discussion and embodiments include the normalized cross-coupled impedance $Z_{np}/Z_{pp}$, the normalized cross-coupled impedance $Z_{np}/Z_{nn}$ may be used interchangeably.

Figure 3A:
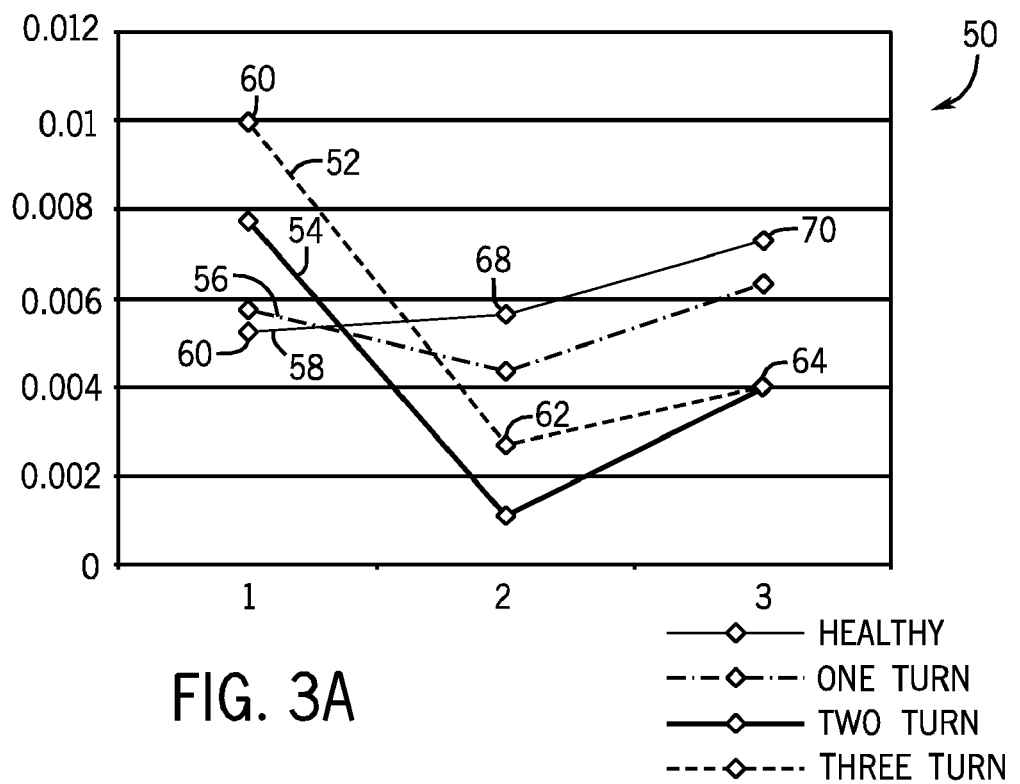
FIGS. 3A and 3B depict the results of the residual voltage and/or impedance compensation applied to a normalized cross-coupled impedance in accordance with an embodiment of the present invention.
Figure 3B:
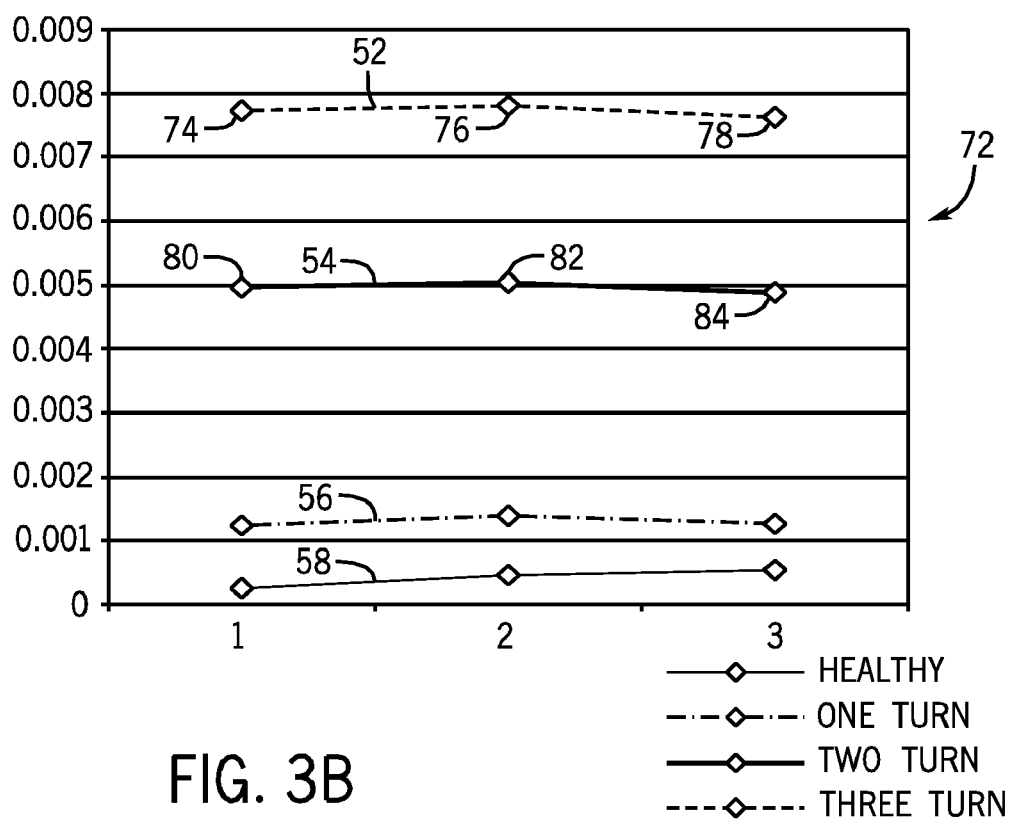

FIGS. 3A and 3B depict the results of the residual voltage and/or impedance compensation discussed above. FIG. 3A is graph 50 of four $Z_{np}/Z_{pp}$ values, each value indicative of the number of turn faults of the stator assembly 16 of the motor 10. The y-axis of the graph 50 is the value of $Z_{np}/Z_{pp}$, and the x-axis illustrates the difference in gain of the measuring equipment of the motor 10. For example, the first line 52 illustrates a healthy motor having zero turn faults. The second line 54 illustrates a motor 10 that has one turn fault, the third line 56 illustrates a motor 10 that has two turn faults, and the fourth line 58 illustrates a motor having three turn faults.

Point 1 on the x-axis corresponds to a point when all three phases of the voltages and currents of the motor 10 have equal gains and phases. Point 2 on the x-axis corresponds to a point in which the gain of one phase is decreased by 5%, and Point 3 corresponds to a point in which the gain of the two phases is decreased by 5%. As shown in the graph 50, the computed values for each $Z_{np}/Z_{pp}$ shown by lines 52, 54, 56, and 58 do not remain constant as the gain is changed. For example, the $Z_{np}/Z_{pp}$ values of the first line 52, representing a healthy (zero turn faults) motor, moves between points 60, 62, and 64. Similarly, the $Z_{np}/Z_{pp}$ values of the third line 54, representing a motor having two turn faults, moves between points 66, 68, and 70, as the gains of the phases decreases. The $Z_{np}/Z_{pp}$ lines 54 and 56 also vary as the gain is changed along the x-axis.

FIG. 3B is a graph 72 illustrating the $Z_{np}/Z_{pp}$ values described above after compensation for residual voltage or residual impedance using Equations 4 and 5 as described above. As shown in the graph 72, the value of $Z_{np}/Z_{pp}$ of line 52, corresponding to a healthy motor 10, remains relatively constant among points 74, 76, and 78 as the gain decreases. Similarly, the values of $Z_{np}/Z_{pp}$ for lines 54, 56, and 58 all remain relatively constant among points 80, 82, and 84 as the gain decreases. Thus, using the compensation equations 4 and 5, the determined $Z_{np}/Z_{pp}$ of a motor 10 may remain relatively constant despite changes in gain that may be introduced through the measuring equipment, such as current or potential transformers.

As further illustrative of the compensation techniques discussed above, FIGS. 4A-C depict graphs of the normalized cross-coupled impedance $Z_{np}/Z_{pp}$ for 512 different combinations in which the gains and phase of the measuring current transformers and potential transformers are changed by 5% and 2.5 degrees, respectively. As illustrated in FIG. 4A, the $Z_{np}/Z_{pp}$ values vary widely for healthy motors, motors with one turn fault, motors with two turn faults, and motors with three turn faults. As shown FIG. 4B, introduction of residual voltage compensation results in relatively stable values of normalized cross-coupled impedance for the healthy motor and the motors having one, two, and three turn faults. Similarly, as shown in FIG. 4C, introduction of residual impedance compensation results in relatively stable values of normalized cross-coupled impedance for the health motors and the motors having one, two and three turn faults.

In other embodiments, determination of the various phasors used in determination of normalized cross-coupled impedance may also include frequency compensation. Various embodiments may use different techniques to estimate the phasors of the measured voltages and currents used as inputs into the normalized cross-coupled impedance determination. These techniques may include, but are not limited to, discrete Fourier transform (DFT), cosine algorithm, least square algorithm, Kalman Filter, Wavelet transform, and/or any suitable technique.

In one embodiment, use of these techniques may include frequency compensation to compensate for off-nominal frequency effects. This off-nominal frequency effect may introduce error into the determination of sequence components that in turn affects the determination of the normalized cross-coupled impedance. For example, in an embodiment using DFT to determine the phasor components, the DFT calculation may include frequency compensation. In such an embodiment, the frequency compensation may result in no effect to the normalized cross-coupled impedance for a deviation of up to ±5% from the nominal frequency.

As described above, one of the parameters used in the determination of the normalized cross-coupled impedance is the negative sequence impedance, $Z_{nn}$. The negative sequence impedance may be affected by changes in temperature of the motor 10. Because the negative sequence is a function of resistance and inductance, and resistance is a function of temperature, fluctuations in temperature may result in changes to the negative sequence impedance. For example, when the motor 10 begins operation, the temperature of the motor 10 is at or nearly ambient temperature. As the motor 10 continues to operate, the temperature of the motor 10 may increase.

In one embodiment, the motor 22 may include a thermistor, and/or any other suitable temperature-measuring device coupled to the motor 22 to determine the temperature. Additionally, the device 24 may include an alarm, motor shutoff, or other action if the measured temperature reaches a specified threshold temperature or remains above a specified threshold temperature for a specified duration. Using the measured temperature, the device 24 may compensate for the negative sequence impedance before determination of the normalized cross-coupled impedance. For example, the device 24 may continuously update the negative sequence impedance (e.g., tuning the negative sequence impedance) based on the measured temperature. The update to the negative sequence impedance may be performed at specific intervals or in response to specified changes in temperature.

In one embodiment, operation and monitoring of the motor 10 may include a learning phase and a monitoring phase. The learning phase may run once during startup of the motor 10 for a given setup of current transformers, potential transformers, and rated motor parameters (e.g., horsepower, number of poles, line-to-to-line voltage, etc.). After the learning phase is complete, the monitoring phase may continuously operate during the operation of the motor 10, and may check various parameters and take the appropriate action.

FIG. 5 depicts a process 100 of a learning phase for a motor 10 in accordance with an embodiment of the invention. The learning phase process 100 starts upon start-up of the device 24 and the motor 10 (block 102). The standstill negative sequence impedance $Z_{nn}$ may be determined (block 104). The three phase voltages $V_a$, $V_b$, and $V_c$ and the three-phase currents $I_a$, $I_b$, and $I_c$ are acquired from the transformers or other components on the motor 10 (block 106) and received by the device 24 or other device coupled to the motor 10. The differential voltages $V_{ab}$, $V_{bc}$, and $V_{ca}$ may be determined from the measured three-phase voltages (block 108). The voltages and currents may be passed through a single phase phase-locked loop (PLL) to obtain the magnitude and angle on each voltage and current, and the magnitude and phase information of each voltage and current may be combined to create current and voltage phasors (block 110). The device 24 may apply a symmetrical sequence transformation to convert voltages and currents from the a-b-c phase to the positive, negative and zero sequence frame (block 112).

The normalized cross-coupled impedance may be determined (block 114). It should be appreciated that the normalized cross-coupled impedance may be normalized with respect to the negative sequence impedance $Z_{nn}$ or the positive sequence impedance $Z_{pp}$, or both normalized values may be determined. The normalized cross-coupled impedance may be averaged over an averaging duration, $T_{avg}$ (block 116). The averaging duration $T_{avg}$ may be 2.5 sec, 5 sec, 10 sec, 15 sec, 20 sec, 25 sec, or any suitable duration. As indicated by decision block 118, the learning phase process 100 checks to determine if the duration $T_{avg}$ has elapsed. If the duration has not expired/elapsed, then the process 100 continues, as indicated by arrow 118. If the duration is done, the process 100 determines a residual impedance $Z_{base}$ (block 122), as discussed above in Equation 4. After the determination of the residual base impedance, operation of the motor 10 may move onto the monitoring phase (block 122).

FIG. 6 depicts the monitoring phase process 124 of the motor 10 in accordance with an embodiment of the present invention. The monitoring phase process 124 operates similarly to the learning phase 100, but includes additional monitoring and alerts of the motor 10. As described above in FIG. 5, the start of the process 124 (block 126) begins after handoff from the learning phase process 100. Similar to the learning phase process 100 discussed above, the monitoring phase process 124 may acquire three-phase voltages and currents (block 128). Additionally, the monitoring phase may acquire the operating temperature of the motor 10, such as from the thermistors 38 or other sensor, and compensate the negative sequence impedance $Z_{nn}$, determined during the learning phase, for any changes in temperature (block 130). The process 124 may determine differential voltages between the phases (block 132), and creating phasors from magnitude and phase information, using the frequency compensation discussed above (block 134).

The symmetrical components may be determined from the three-phase voltages and currents (block 136) and the normalized cross-coupled impedance with respect to positive sequence impedance (and/or negative sequence impedance) determined as discussed above (block 138). The normalized cross-coupled impedance may be computed and averaged over an averaging duration $T_{avg}$ (block 140). Thus, the process 124 may check to determine if the averaging duration $T_{avg}$ has elapsed (decision block 142), returning to block 128 if the monitoring duration has not elapsed (as indicated by arrow 144). If the averaging duration has elapsed, the process 124 may determine the corrected normalized cross-coupled impedance using the $Z_{base}$ value determined in the learning phase to compensate for residual impedance (block 146), as discussed above.

In this embodiment, the corrected normalized cross-coupled impedance $Z_{np}/Z_{pp}$ may be compared to different thresholds to determine the number and/or severity of the turn faults. For example, two thresholds may be used, referred to as Threshold 1 and Threshold 2, in which Threshold 2 is higher than Threshold 1 and indicates a greater number and/or severity of turn faults.

The normalized cross-coupled impedance may be compared to Threshold 2, (decision block 148) that is indicative of multiple and/or more severe turn faults. If the normalized cross-coupled impedance is greater than Threshold 2, the process 124 may trigger a second alarm and trip the motor 10, disabling the operation of the motor 10 (block 150).

If the normalized cross-coupled impedance is below Threshold 2, then the process 124 compares the normalized cross-coupled impedance to Threshold 1 (decision block 152). If the normalized cross-coupled impedance is below Threshold 1, the monitoring phase process 124 continues normally, as indicated by arrow 154. If the normalized cross-coupled impedance is above Threshold 1, then a first alarm may be triggered (block 156). In other embodiments, any number of thresholds may be used to indicate various numbers and/or severity of turn faults, such as three thresholds, four thresholds, five thresholds, etc.

It should be appreciated that the learning phase and monitoring phase may include any of the compensation factors determined above, such as residual impedance $Z_{base}$, residual voltage $V_{base}$, frequency compensation, and/or temperature compensation. For example, compensation for the residual voltage may be included in addition to or instead of the compensation for the residual impedance. Additionally, various embodiments may include or omit frequency compensation for determination of the phasors, and/or compensation for temperature for determination of the negative sequence impedance.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of determining turn faults in a stator of a motor, comprising:
    determining a standstill negative sequence impedance of the motor;
    determining a residual voltage;
    determining a residual impedance;
    measuring a temperature of the motor;
    calculating an operating negative sequence impedance of the motor based on the temperature of the motor and the standstill negative sequence impedance of the motor; and
    determining a parameter indicative of the number of turn faults in the stator, based on the residual voltage, residual impedance operating negative sequence impedance, or a combination thereof.

2. The method of claim 1, comprising determining a negative sequence voltage, determining a negative sequence current and a positive sequence current, and determining a negative sequence impedance.

3. The method of claim 1, wherein determining a parameter comprises determining a normalized cross-coupled impedance from a negative sequence voltage of the motor, negative sequence current of the motor, positive sequence current of the motor, a negative sequence impedance of the motor, positive sequence impedance, of the motor or any combination thereof.

4. The method of claim 3, wherein determining the normalized cross-coupled impedance comprises averaging the normalized cross-coupled impedance over a duration.

5. The method of claim 1, wherein determining the residual voltage comprises determining a base voltage from a negative sequence voltage, negative sequence impedance, and negative sequence current of the motor.

6. The method of claim 1, wherein determining the residual impedance comprises determining a base impedance from a negative sequence voltage, negative sequence impedance, negative sequence current, and positive sequence voltage of the motor.

7. The method of claim 1, comprising determining a negative sequence impedance of the motor based on the temperature.

8. The method of claim 1, comprising measuring voltages and currents of the motor.

9. The method of claim 1, comprising determining phasors of the measured voltages and currents based on frequency compensation.

10. A method of determining turn faults in a stator of a motor, comprising:
    determining a negative sequence impedance;
    measuring a temperature of the motor;
    modifying the negative sequence impedance based on the temperature; and
    determining a parameter indicative of the number of turn faults in the stator based on the negative sequence impedance.

11. The method of claim 10, wherein determining a parameter comprises determining a normalized cross-coupled impedance from a negative sequence voltage of the motor, a negative sequence current of the motor, a positive sequence current of the motor, the negative sequence impedance of the motor, a positive sequence impedance, of the motor or any combination thereof.

12. A system for determining turn faults in a stator of a motor, comprising:
    a device coupled to the induction motor and configured to measure characteristics of the motor, the device comprising a memory; and
    a temperature sensor configured to measure an operating temperature of the motor,
    wherein the memory comprises instructions for:
        determining a residual voltage;
        determining a residual impedance;
        determining a negative sequence impedance;
        modifying the negative sequence impedance based on the operating temperature of the motor; and
        determining a parameter indicative of the number of turn faults in the stator based on the residual voltage, residual impedance, negative sequence impedance, or a combination thereof.

13. The system of claim 12, wherein determining a parameter comprises:
    determining a normalized cross-coupled impedance from a negative sequence voltage of the motor, negative sequence current of the motor, positive sequence current of the motor, a negative sequence impedance of the motor, positive sequence impedance, of the motor or any combination thereof.

14. The system of claim 12, wherein the memory comprises instructions for determining a negative sequence impedance of the motor based on the temperature.

15. The system of claim 12, comprising one or more potential transformers configured to measure one or more voltages of the motor and one or more current transformers configured to measure one or more currents of the motor.

16. The system of claim 15, wherein the memory comprises instructions for determining phasors of the voltages and phasors of the currents, wherein the determining comprises compensating for variations from a nominal frequency.

* * * * *